US012284762B2

(12) United States Patent
Sasaki et al.

(10) Patent No.: US 12,284,762 B2
(45) Date of Patent: Apr. 22, 2025

(54) CIRCUIT ASSEMBLY

(71) Applicant: Sumitomo Wiring Systems, Ltd., Yokkaichi (JP)

(72) Inventors: Yoshikazu Sasaki, Yokkaichi (JP); Junya Aichi, Yokkaichi (JP); Hiroto Hashimoto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 246 days.

(21) Appl. No.: 18/049,772

(22) Filed: Oct. 26, 2022

(65) Prior Publication Data

US 2023/0133266 A1 May 4, 2023

(30) Foreign Application Priority Data

Oct. 29, 2021 (JP) .................. 2021-177058

(51) Int. Cl.
| | |
|---|---|
| *H05K 1/02* | (2006.01) |
| *G06F 3/047* | (2006.01) |
| *H01L 21/56* | (2006.01) |
| *H01L 21/82* | (2006.01) |
| *H01L 23/10* | (2006.01) |
| *H01L 23/24* | (2006.01) |
| *H01L 23/29* | (2006.01) |
| *H01L 23/492* | (2006.01) |

(Continued)

(52) U.S. Cl.
CPC ..................... *H05K 1/18* (2013.01)

(58) Field of Classification Search
CPC ........ H05K 1/02; H05K 1/028; H05K 1/0281; H05K 1/0298; H05K 1/097; H05K 1/11; H05K 1/18; H05K 1/116; H05K 1/147; H05K 1/181; H05K 1/189; H05K 3/062; H05K 3/108; H05K 3/243; G06F 3/0412; G06F 3/0443; G06F 3/0445; G06F 3/0446; G06F 3/047; G06F 3/04164; H01L 21/56; H01L 21/82; H01L 21/4845; H01L 23/10; H01L 23/24; H01L 23/29; H01L 23/492; H01L 23/562; H01L 23/3735; H01L 23/3164; H01L 23/5385; H01L 23/5386; H01L 23/49844; H01L 24/06; H01L 24/37; H01L 24/40; H01L 24/84
USPC ............ 361/760; 174/250, 255, 257; 29/829
See application file for complete search history.

(56) References Cited

U.S. PATENT DOCUMENTS

| | | | |
|---|---|---|---|
| 2009/0288861 A1* | 11/2009 | Liao ................ | H05K 3/243 |
| | | | 29/829 |
| 2009/0308647 A1* | 12/2009 | Liao ................ | H05K 3/243 |
| | | | 174/250 |
| 2018/0192477 A1* | 7/2018 | Klein ............. | B32B 17/10385 |

(Continued)

*Primary Examiner* — Xiaoliang Chen
(74) *Attorney, Agent, or Firm* — Honigman LLP

(57) ABSTRACT

A circuit assembly includes a first conductive member; a second conductive member; and a holding member that is insulating and holds the first conductive member and the second conductive member; wherein the first conductive member has a first exposed surface exposed from the holding member, the second conductive member has a second exposed surface exposed from the holding member, the holding member includes an insulating portion located between the first exposed surface and the second exposed surface, and a conductive film covers at least a part of the first exposed surface and at least a part of the second exposed surface, while extending over the insulating portion.

7 Claims, 4 Drawing Sheets

(51) Int. Cl.
 *H05K 1/11* (2006.01)
 *H05K 1/18* (2006.01)

(56) References Cited

U.S. PATENT DOCUMENTS

| | | | |
|---|---|---|---|
| 2018/0335874 A1* | 11/2018 | Li | G06F 3/047 |
| 2018/0368249 A1* | 12/2018 | Chin | B60R 16/02 |
| 2019/0164878 A1* | 5/2019 | Hattori | H05K 7/14322 |
| 2020/0294925 A1* | 9/2020 | Yamada | H01L 24/06 |
| 2020/0294953 A1* | 9/2020 | Yamada | H01L 21/56 |
| 2021/0048919 A1* | 2/2021 | Son | H05K 1/189 |

* cited by examiner

CIRCUIT ASSEMBLY

CROSS-REFERENCE TO RELATED APPLICATIONS

This application claims priority of Japanese Patent Application No. JP 2021-177058 filed on Oct. 29, 2021, the contents of which are incorporated herein.

TECHNICAL FIELD

The present disclosure relates to a circuit assembly.

BACKGROUND

Conventional circuit assemblies include a control substrate, a plurality of power supply terminals that supply electric power to the control substrate, and a plurality of busbars that are electrically connected to the power supply terminals, and constitute an electric power circuit (see JP 2019-96769A, for example). As shown in FIG. 4, terminals 91 of a conventional circuit assembly 90 are electrically connected to busbars 92 by welding.

JP 2019-96769A is an example of related art.

SUMMARY

In the conventional circuit assembly 90, the terminals 91 need to be provided with hold-down surfaces 91a in order to weld the terminals 91 to the busbars 92. Therefore, the space for placing the terminals 91 increases, resulting in a larger circuit assembly 90.

Therefore, it is an object of the present disclosure to reduce the size of a circuit assembly.

According to an aspect of the present disclosure, a circuit assembly includes a first conductive member; a second conductive member; and a holding member that is insulating and holds the first conductive member and the second conductive member; wherein the first conductive member has a first exposed surface exposed from the holding member, the second conductive member has a second exposed surface exposed from the holding member, the holding member includes an insulating portion located between the first exposed surface and the second exposed surface, and a conductive film covers at least a part of the first exposed surface and at least a part of the second exposed surface, while extending over the insulating portion.

According to the present disclosure, it is possible to reduce the size of a circuit assembly.

DETAILED DESCRIPTION OF PREFERRED EMBODIMENTS

First, embodiments of the present disclosure will be listed and described.

A circuit assembly of the present disclosure includes: a first conductive member; a second conductive member; and a holding member that is insulating and holds the first conductive member and the second conductive member; wherein the first conductive member has a first exposed surface exposed from the holding member, the second conductive member has a second exposed surface exposed from the holding member, the holding member includes an insulating portion located between the first exposed surface and the second exposed surface, and a conductive film covers at least a part of the first exposed surface and at least a part of the second exposed surface, while extending over the insulating portion.

According to this circuit assembly, since the first conductive member and the second conductive member held by the holding member respectively have the first exposed surface and the second exposed surface exposed from the holding member, and at least a part of the first exposed surface and at least a part of the second exposed surface are covered by the conductive film that extends over the insulating portion, the two exposed surfaces can be electrically connected to each other by the conductive film. With this, there is no need of forming any hold-down surface for welding on one of the first conductive member and the second conductive member, and thus it is possible to downsize that exposed surface. As a result, it is possible to reduce the size of a circuit assembly.

Preferably, parts of the first conductive member other than the first exposed surface are buried in the holding member, and parts of the second conductive member other than the second exposed surface are buried in the holding member.

In this case, by performing, for example, insert molding to bury a part of the first conductive member and a part of the second conductive member into the holding member, it is easy to form the first exposed surface and the second exposed surface.

Preferably, the conductive film is a metal plating film.

In this case, it is easy to form the conductive film.

Preferably, the first conductive member has a cut-out portion that is cut out and surrounds the second exposed surface.

In this case, it is possible to suppress heat generation of the first conductive member that may occur due to a high current, compared to a case where the first conductive member has a hole that surrounds the second exposed surface.

Preferably, the first exposed surface and the second exposed surface are coplanar with a surface of the insulating portion that faces the conductive film.

In this case, it is possible to form the conductive films more easily.

The following will describe details of the embodiment of the present disclosure with reference to the drawings. Note that at least some features of the embodiment described below may be combined with each other as appropriate.

Circuit Assembly

Figure 1:
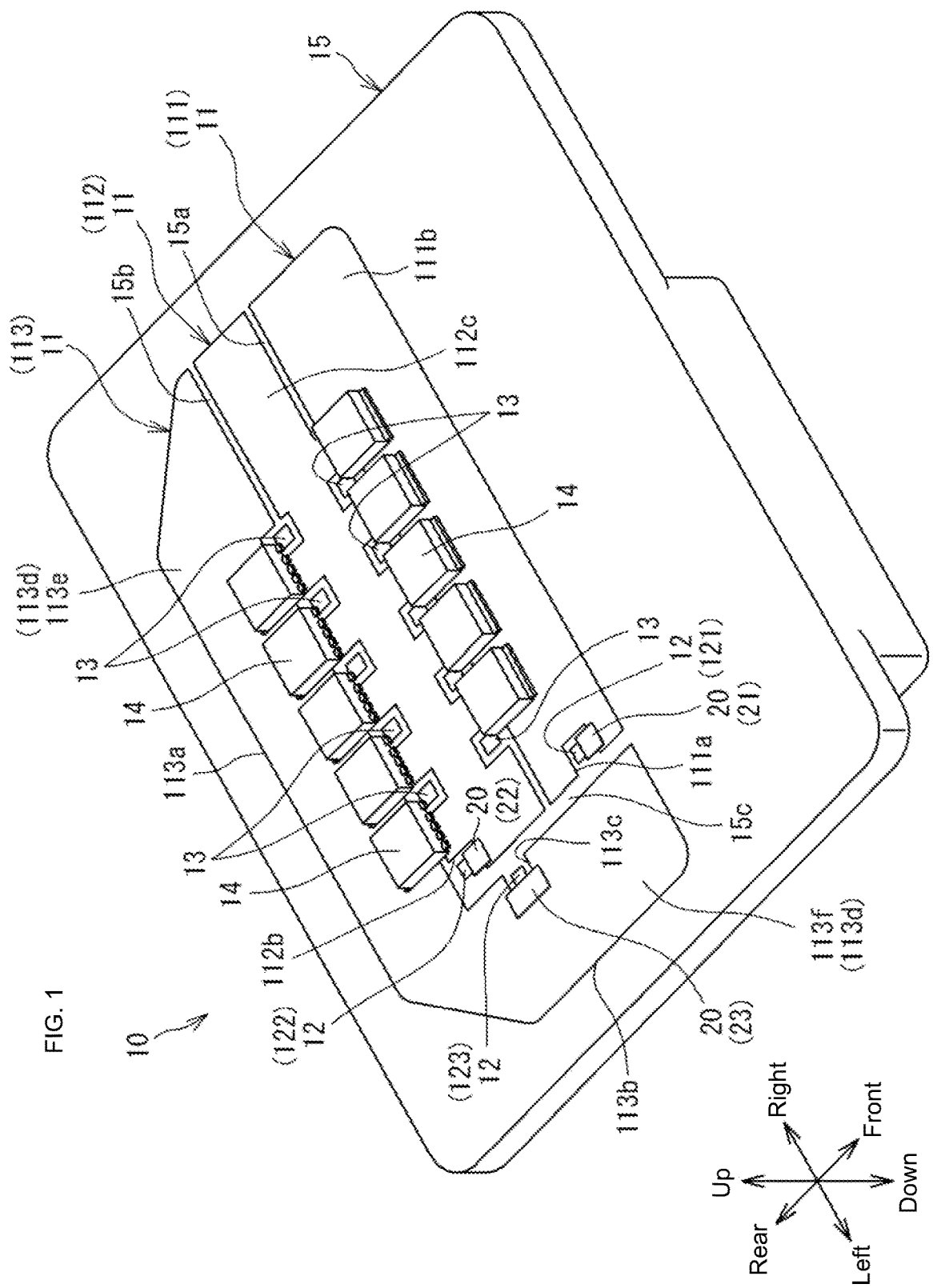
FIG. 1 is a perspective view illustrating a circuit assembly according to an embodiment.
Figure 2:
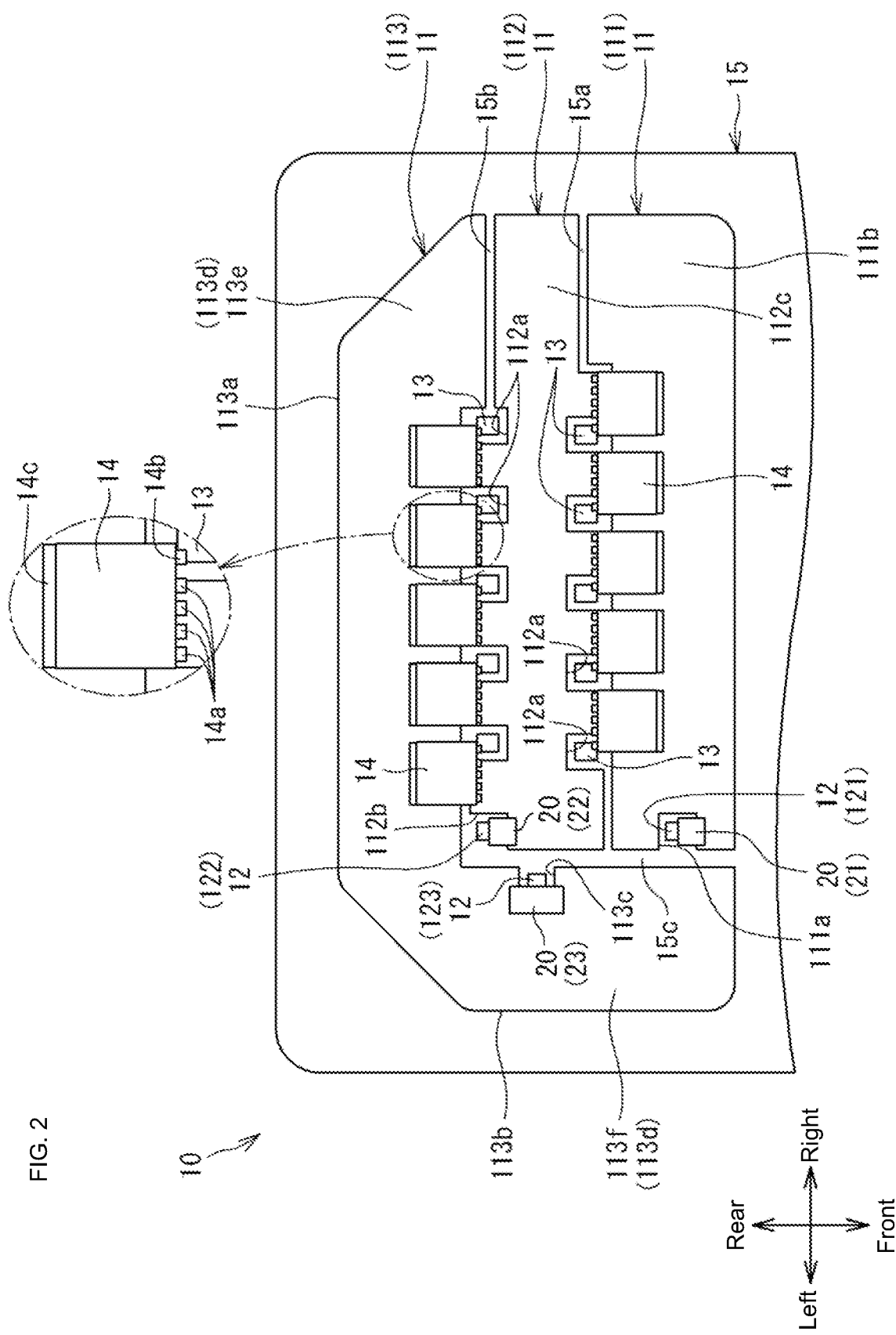
FIG. 2 is a plan view illustrating the circuit assembly.

FIG. 1 is a perspective view showing a circuit assembly 10 according to the present embodiment. FIG. 2 is a plan view of the circuit assembly 10. In the following description of the present embodiment, directions such as "up", "down", "right", "left", "front/forward", and "rear" are based on the directions indicated in FIG. 1.

In FIGS. 1 and 2, the circuit assembly 10 can be installed in various devices, and the circuit assembly 10 of the present embodiment is installed in a vehicle. More specifically, the circuit assembly 10 is assembled in an electrical junction box disposed at a midway position of a wiring route connecting a not-shown first in-vehicle device and a not-shown second in-vehicle device. The circuit assembly 10 includes a plurality of conductive plates (first conductive members)

11, a plurality of power supply terminals (second conductive members) 12, a plurality of control terminals 13, a plurality of electronic components 14, and a holding member 15. The plurality of conductive plates 11, the plurality of power supply terminals 12, and the plurality of control terminals 13 constitute an electric power circuit of the circuit assembly 10.

The circuit assembly 10 of the present embodiment includes three conductive plates 11. The number of conductive plates 11 and the number of power supply terminals 12 are the same, and one conductive plate 11 and one power supply terminal 12 are electrically connected to each other in a one-to-one relationship. Also, the circuit assembly 10 of the present embodiment includes ten control terminals 13. The number of control terminals 13 and the number of electronic components 14 are the same, and one control terminal 13 and one electronic component 14 are electrically connected to each other in a one-to-one relationship. Note that the numbers of conductive plates 11, power supply terminals 12, control terminals 13, and electronic components 14 are suitably selected, and can be changed as appropriate.

The conductive plates 11 are manufactured by pressing a metal plate into a predetermined shape, and are referred to also as "busbars". The conductive plates 11 are preferably copper members made of, for example, pure copper, a copper alloy, or the like. The entire conductive plates 11 are conductors, and the conductive plates 11 do not have any wiring patterns as formed on a typical printed board. The circuit assembly 10 of the present embodiment includes, as the plurality of conductive plates 11, a first conductive plate 111, a second conductive plate 112, and a third conductive plate 113.

The first conductive plate 111 is arranged at the frontmost position, and extends in a left-right direction. The second conductive plate 112 is arranged behind the first conductive plate 111 at a distance thereto, and extends in the left-right direction. On both front and rear sides of the second conductive plate 112, a plurality of recesses 112a are formed at intervals in the left-right direction (see also FIG. 3). In the present embodiment, on each of the front and rear sides of the second conductive plate 112, five recesses 112a are formed.

The third conductive plate 113 includes a conductive body portion 113a that extends in the left-right direction, and a conductive extension portion 113b that extends forward from a left end portion of the conductive body portion 113a. The conductive body portion 113a is arranged behind the second conductive plate 112 at a distance thereto. A front portion of the conductive extension portion 113b extends to a position located on the left side of the first conductive plate 111. The conductive extension portion 113b is arranged on the left side of the first conductive plate 111 and the second conductive plate 112 at a distance thereto. Note that the shapes of the first conductive plate 111, the second conductive plate 112, and the third conductive plate 113 are not limited to the shapes employed in the present embodiment. For example, the third conductive plate 113 may be constituted only by the conductive body portion 113a.

The power supply terminals 12 are manufactured by pressing a metal wire material into a predetermined shape. The power supply terminals 12 are terminals made of metal. The power supply terminals 12 are preferably copper members made of, for example, pure copper, a copper alloy, or the like. The power supply terminals 12 are electrically connected to the conductive plates 11 via later-described conductive films 20, and supply electric power to a not-shown control substrate from the conductive plates 11.

The circuit assembly 10 of the present embodiment includes, as the plurality of power supply terminals 12, a first power supply terminal 121, a second power supply terminal 122, and a third power supply terminal 123. The first power supply terminal 121 is arranged on the left side of the first conductive plate 111. The second power supply terminal 122 is arranged on the left side of the second conductive plate 112. The third power supply terminal 123 is arranged on the right side of an extended conductive portion 113b of the third conductive plate 113.

The control terminals 13 are manufactured by pressing a metal wire material into a predetermined shape. The control terminals 13 are terminals made of metal. The control terminals 13 are preferably members made of copper such as, for example, pure copper, a copper alloy, or the like. In the present embodiment, the plurality of control terminals 13 are arranged in the recesses 112a formed in the second conductive plate 112 on the front and rear sides. The plurality of control terminals 13 extend downward, and are electrically connected to the control substrate.

The electronic components 14 are, for example, semiconductor relays such as field effect transistors (FETs). The following describes a case where the electronic components 14 are field effect transistors, and the field effect transistors are denoted as "FETs". The plurality of FETs 14 are placed on the first conductive plate 111 and the third conductive plate 113 at intervals in the left-right direction.

Each of the FETs 14 includes a plurality of terminals. As shown in an enlarged portion in FIG. 2, each FET 14 includes, as the plurality of terminals, a plurality of (four in the illustration) source terminals 14a, one gate terminal 14b, and one drain terminal 14c (see also FIG. 3). The source terminals 14a are electrically connected to the second conductive plate 112 with solder or the like.

The gate terminal 14b is electrically connected to the corresponding control terminal 13 with solder or the like. The drain terminal 14c is electrically connected to the first conductive plate 111 or the third conductive plate 113 with solder or the like. Note that the electronic components 14 may be components other than field effect transistors, and may also be mechanical relays, for example.

The holding member 15 is made of a thermoplastic resin. The holding member 15 is made of, for example, PPS (polyphenylene sulfide), PBT (polybutylene terephthalate), nylon, PP (polypropylene), PE (polyethylene), or the like, and is insulating. The holding member 15 of the present embodiment is made of PPS. The holding member 15 is formed by injection molding. In the present embodiment, the holding member 15 is manufactured by insert molding performed with the conductive plates 11, the power supply terminals 12, and the control terminals 13 placed in an injection molding die (not shown). With this, the holding member 15 holds the conductive plates 11, the power supply terminals 12, and the control terminals 13. The conductive plates 11, the power supply terminals 12, the control terminals 13, and the holding member 15 serve as an insert-molded article formed in one piece.

Exposed Surface

The conductive plates 11 each have an exposed surface (first exposed surface) that is exposed from the holding member 15. Specifically, the first conductive plate 111 has an exposed surface 111b that is exposed from the holding member 15 to the upper side. The parts (located below the exposed surface 111b) of the first conductive plate 111 other than the exposed surface 111b are buried in the holding member 15. A predetermined number of (five in the illustration) FETs 14 are placed on the exposed surface 111b. The second conductive plate 112 has an exposed surface 112c that is exposed from the holding member 15 to the upper side. The parts (located below the exposed surface 112c) of the second conductive plate 112 other than the exposed surface 112c are buried in the holding member 15.

The third conductive plate 113 includes an exposed surface 113d that is exposed from the holding member 15 to the upper side. The exposed surface 113d includes a main exposed surface 113e in the conductive body portion 113a that is exposed from the holding member 15, and an extended exposed surface 113f in the conductive extension portion 113b that is exposed from the holding member 15. The parts (located below the exposed surface 113d) of the third conductive plate 113 other than the exposed surface 113d are buried in the holding member 15. A predetermined number of (five in the illustration) remaining FETs 14 are placed on the exposed surface 113d.

Figure 3:
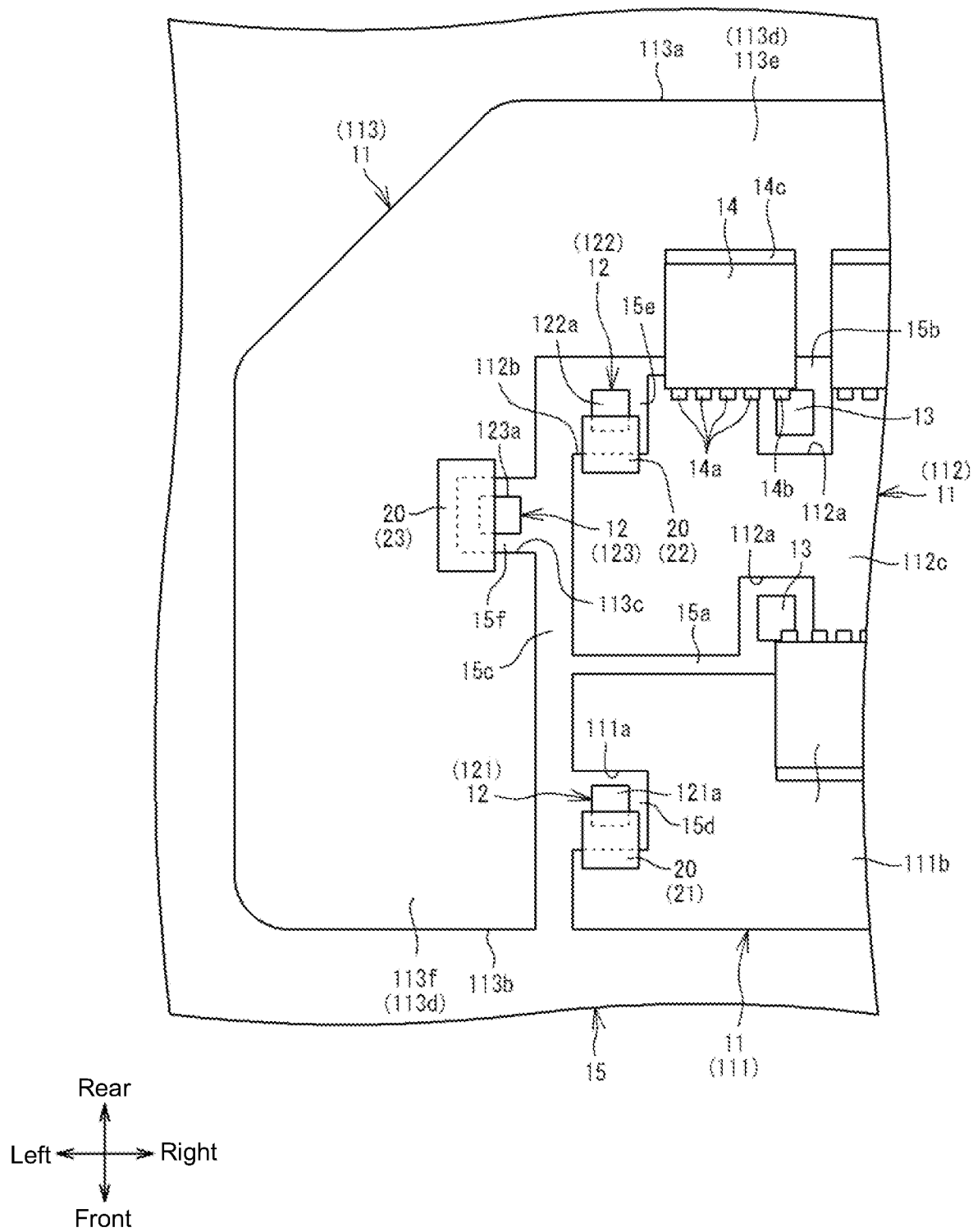
FIG. 3 is an enlarged plan view illustrating the vicinity of power supply terminals.
Figure 4:
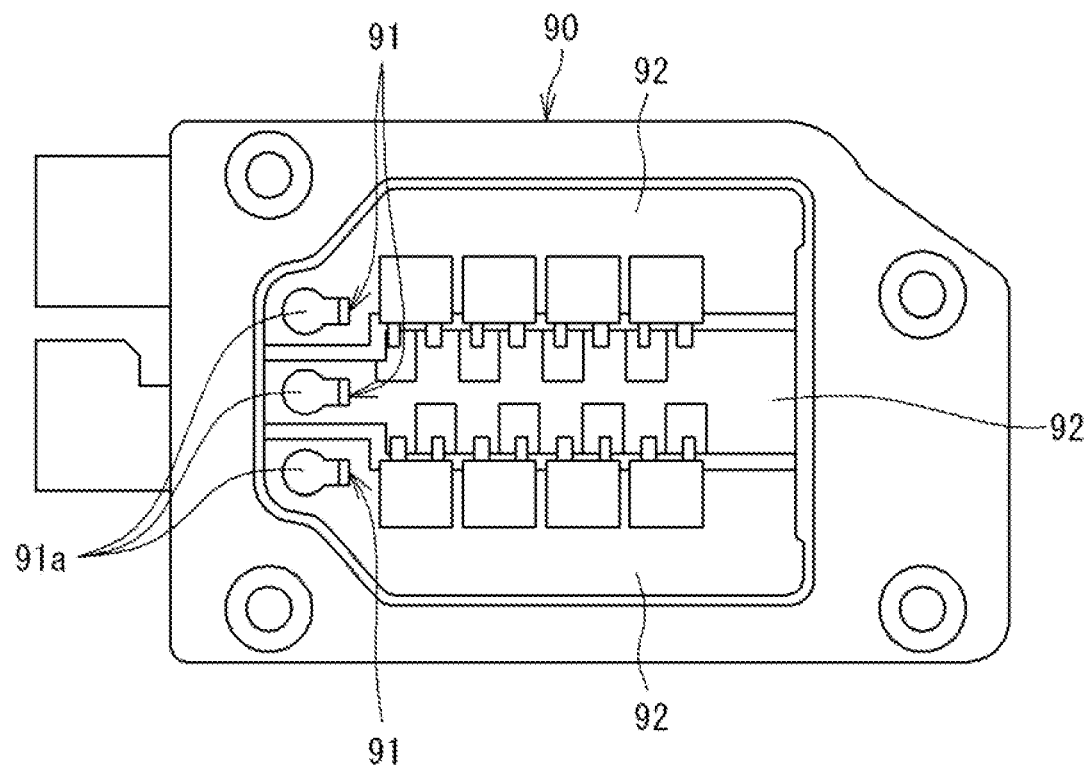
FIG. 4 is a perspective view illustrating a conventional circuit assembly.

FIG. 3 is an enlarged plan view showing the vicinity of the power supply terminals 12. In FIG. 3, each of the power supply terminals 12 has an exposed surface (second exposed surface) exposed from the holding member 15. Specifically, the first power supply terminal 121 has an exposed surface 121a exposed from the holding member 15 to the upper side. The second power supply terminal 122 has an exposed surface 122a exposed from the holding member 15 to the upper side. The third power supply terminal 123 has an exposed surface 123a exposed from the holding member 15 to the upper side. The parts (located below the exposed surfaces 121a, 122a, and 123a) of the power supply terminals 121, 122, and 123 other than the exposed surfaces 121a, 122a, and 123a are buried in the holding member 15.

Cut-Out Portion

A cut-out portion 111a is formed in a left end portion of the first conductive plate 111, surrounding the exposed surface 121a of the first power supply terminal 121. The cut-out portion 111a of the present embodiment is recess-shaped, opening to the left side thereof. A cut-out portion 112b is formed in the corner on the rear left side of the second conductive plate 112, surrounding the exposed surface 122a of the second power supply terminal 122. The cut-out portion 112b of the present embodiment is cut out in an L-shape, opening to the rear and left sides. A cut-out portion 113c is formed in a right end portion of the extended conductive portion 113b of the third conductive plate 113, surrounding the exposed surface 123a of the third power supply terminal 123. The cut-out portion 113c of the present embodiment is formed recess-shaped, opening to the right side.

Insulating Portions

In FIGS. 2 and 3, the holding member 15 includes, as insulating portions that insulate the exposed surfaces of adjacent conductive plates 11 from each other, a first insulating portion 15a, a second insulating portion 15b, and a third insulating portion 15c. The first insulating portion 15a is located between the exposed surface 111b of the first conductive plate 111 and the exposed surface 112c of the second conductive plate 112, and insulates the exposed surfaces 111b and 112c from each other. The second insulating portion 15b is located between the exposed surface 112c of the second conductive plate 112 and the main exposed surface 113e of the third conductive plate 113, and insulates the exposed surfaces 112c and 113e from each other.

The third insulating portion 15c is located between the extended exposed surface 113f of the third conductive plate 113, and the exposed surfaces 111b and 112c of the first conductive plate 111 and the second conductive plate 112, and insulates the extended exposed surface 113f, and the exposed surfaces 111b and 112c from each other. The third insulating portion 15c is coupled to the left ends of the first insulating portion 15a and the second insulating portion 15b.

In FIG. 3, the holding member 15 includes, as insulating portions that insulate the conductive plates 11 and the exposed surfaces of the power supply terminals 12 from each other, a fourth insulating portion 15d, a fifth insulating portion 15e, and a sixth insulating portion 15f.

The fourth insulating portion 15d is located between the exposed surface 111b of the first conductive plate 111 and the exposed surface 121a of the first power supply terminal 121, and insulates the two exposed surfaces 111b and 121a from each other. The fourth insulating portion 15d of the present embodiment is formed in the cut-out portion 111a of the first conductive plate 111, while being adjacent to the front, right, and rear sides of the exposed surface 121a of the first power supply terminal 121. The fourth insulating portion 15d is coupled to the third insulating portion 15c.

The fifth insulating portion 15e is located between the exposed surface 112c of the second conductive plate 112 and the exposed surface 122a of the second power supply terminal 122, and insulates the two exposed surfaces 112c and 122a from each other. The fifth insulating portion 15e of the present embodiment is formed in the cut-out portion 112b of the second conductive plate 112, while being adjacent to the front and right sides of the exposed surface 122a of the second power supply terminal 122. The fifth insulating portion 15e is coupled to the second insulating portion 15b and the third insulating portion 15c.

The sixth insulating portion 15f is located between the extended exposed surface 113f of the third conductive plate 113 and the exposed surface 123a of the third power supply terminal 123, and insulates the two exposed surfaces 113f and 123a from each other. The sixth insulating portion 15f of the present embodiment is formed in the cut-out portion 113c of the third conductive plate 113, while being adjacent to the front, left, and rear sides of the exposed surface 123a of the third power supply terminal 123. The sixth insulating portion 15f is coupled to the third insulating portion 15c.

The upper surfaces of the first to third insulating portions 15a to 15c, and the upper surfaces of the fourth to sixth insulating portions 15d to 15f (the upper surfaces that face the later-described conductive films 20) are coplanar. Furthermore, the exposed surfaces 111b, 112c, and 113d of the conductive plates 11, and the exposed surfaces 121a, 122a, and 123a of the power supply terminals 12 are coplanar with the upper surfaces of the insulating portions 15a to 15f of the holding member 15 (see also FIG. 1).

Conductive Films

The circuit assembly 10 includes a plurality of conductive films 20 that electrically connect the conductive plates 11 to the power supply terminals 12. The conductive films 20 are deposited by vacuum vapor deposition, for example. The conductive films 20 of the present embodiment are metal plating films in which a nickel plating layer is laminated on a copper plating layer. The circuit assembly 10 of the present embodiment includes, as the plurality of conductive films 20, a first conductive film 21, a second conductive film 22, and a third conductive film 23.

The first conductive film 21 electrically connects the first conductive plate 111 and the first power supply terminal 121. Specifically, the first conductive film 21 covers a part (left end portion) of the exposed surface 111b of the first conductive plate 111 and a part (front end portion) of the exposed surface 121a of the first power supply terminal 121 while extending over the fourth insulating portion 15d.

The second conductive film 22 electrically connects the second conductive plate 112 and the second power supply terminal 122. Specifically, the second conductive film 22 covers a part (left end portion) of the exposed surface 112c of the second conductive plate 112 and a part (front end portion) of the exposed surface 122a of the second power supply terminal 122 while extending over the fifth insulating portion 15e.

The third conductive film 23 electrically connects the third conductive plate 113 and third power supply terminal 123. Specifically, the third conductive film 23 covers a part (right end portion) of the extended exposed surface 113f of the third conductive plate 113, and a part (left end portion) of the exposed surface 123a of the third power supply terminal 123, while extending over the sixth insulating portion 15f.

Effects

According to the circuit assembly 10 of the present embodiment, the exposed surfaces 111b, 112c, and 113d of the conductive plates 11 exposed from the holding member 15 and the exposed surfaces 121a, 122a, and 123a of the power supply terminals 12 exposed from the holding member 15 are covered by the conductive films 20 that extends over the insulating portions 15d, 15e, and 15f, and thus the conductive plates 11 and the power supply terminals 12 are electrically connected by the conductive films 20. With this, there is no need of forming any hold-down surface for welding on the power supply terminal 12, making it possible to downsize the exposed surfaces 121a, 122a, and 123a of the power supply terminals 12. As a result, it is possible to reduce the size of the circuit assembly 10.

By insert molding, parts of the conductive plates 11 other than the exposed surfaces 111b, 112c, and 113d are buried in the holding member 15, and parts of the power supply terminals 12 other than the exposed surfaces 121a, 122a, and 123a are buried in the holding member 15. With this, the exposed surfaces 111b, 112c, and 113d of the conductive plates 11, and the exposed surfaces 121a, 122a, and 123a of the power supply terminals 12 can be formed easily.

The cut-out portions 111a, 112b, and 113c are respectively formed in the conductive plates 11, surrounding the exposed surfaces 121a, 122a, and 123a of the power supply terminals 12. Accordingly, it is possible to suppress heat generation of the conductive plates 11 that may occur due to a high current, compared to a case where the conductive plates 11 have holes that surround the respective power supply terminal 12.

Since the conductive films 20 are metal plating films, it is easy to form the conductive films 20. Also, by using metal plating films as the conductive films 20, it is also possible to mount another electronic component on the conductive films 20.

Since the exposed surfaces 111b, 112c, and 113d of the conductive plates 11, the exposed surfaces 121a, 122a, and 123a of the power supply terminals 12, and the upper surfaces of the insulating portions 15d, 15e, and 15f are coplanar, it is easy to form the conductive films 20.

Other Considerations

Although the conductive films 20 of the present embodiment cover parts of the exposed surfaces (first exposed surfaces) 111b, 112c, and 113d of the conductive plates 11, the conductive films 20 may also cover the entire exposed surfaces 111b, 112c, and 113d. Also, although the conductive films 20 cover parts of the exposed surfaces (second exposed surfaces) 121a, 122a, and 123a of the power supply terminals 12, the conductive films 20 may also cover the entire exposed surfaces 121a, 122a, and 123a. The conductive films 20 of the present embodiment are deposited by vacuum vapor deposition. But the present disclosure is not limited to this, and the conductive films 20 may also be deposited by, for example, sputtering, printing, or the like.

The embodiments disclosed herein are to be construed as being exemplary and non-limiting in all respects. The scope of the present disclosure is not defined by the description above but is defined by the claims, and all modifications within the meaning and scope equivalent to the claims are intended to be included.

What is claimed is:

1. A circuit assembly comprising:
a first conductive member;
a second conductive member; and
a holding member that is insulating and holds the first conductive member and the second conductive member;
wherein the first conductive member has a first exposed surface exposed from the holding member,
the second conductive member has a second exposed surface exposed from the holding member,
the holding member includes an insulating portion located between the first exposed surface and the second exposed surface, and
a conductive film covers at least a part of the first exposed surface and at least a part of the second exposed surface, while extending over the insulating portion,
wherein the first conductive member has a cut-out portion that is cut out and surrounds the second exposed surface.

2. The circuit assembly according to claim 1, wherein parts of the first conductive member other than the first exposed surface are buried in the holding member, and
parts of the second conductive member other than the second exposed surface are buried in the holding member.

3. The circuit assembly according to claim 1, wherein the conductive film is a metal plating film.

4. The circuit assembly according to claim 1, wherein the first exposed surface and the second exposed surface are coplanar with a surface of the insulating portion that faces the conductive film.

5. The circuit assembly according to claim 2, wherein the conductive film is a metal plating film.

6. The circuit assembly according to claim 2, wherein the first exposed surface and the second exposed surface are coplanar with a surface of the insulating portion that faces the conductive film.

7. The circuit assembly according to claim 3, wherein the first exposed surface and the second exposed surface are coplanar with a surface of the insulating portion that faces the conductive film.

* * * * *